(12) United States Patent
Lin et al.

(10) Patent No.: US 9,406,590 B2
(45) Date of Patent: Aug. 2, 2016

(54) CHIP PACKAGE AND MANUFACTURING METHOD THEREOF

(71) Applicant: XINTEC INC., Zhongli, Taoyuan County (TW)

(72) Inventors: Chia-Sheng Lin, Zhongli (TW);
Yen-Shih Ho, Kaohsiung (TW);
Tsang-Yu Liu, Zhubei (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 14/255,883

(22) Filed: Apr. 17, 2014

(65) Prior Publication Data

US 2014/0312478 A1 Oct. 23, 2014

Related U.S. Application Data

(60) Provisional application No. 61/813,855, filed on Apr. 19, 2013.

(51) Int. Cl.
*H01L 23/48* (2006.01)
*H01L 23/495* (2006.01)
*H01L 23/00* (2006.01)

(52) U.S. Cl.
CPC ............ *H01L 23/4952* (2013.01); *H01L 24/05* (2013.01); *H01L 24/48* (2013.01); *H01L 24/49* (2013.01); *H01L 2224/04042* (2013.01); *H01L 2224/05554* (2013.01); *H01L 2224/48227* (2013.01); *H01L 2224/48463* (2013.01); *H01L 2224/494* (2013.01); *H01L 2224/8536* (2013.01); *H01L 2924/00014* (2013.01); *H01L 2924/1461* (2013.01)

(58) Field of Classification Search
CPC ..... H01L 23/4952; H01L 24/43; H01L 24/46; H01L 24/85; H01L 224/494; H01L 2924/1461; H01L 2224/8536; H01L 2924/00; H01L 2224/48227; H01L 2224/73265; H01L 2225/06541; H01L 2224/484; H01L 2224/48247; H01L 21/76898
See application file for complete search history.

(56) References Cited

U.S. PATENT DOCUMENTS

| | | | |
|---|---|---|---|
| 6,774,499 B1* | 8/2004 | Yang | H01L 21/568 257/736 |
| 2004/0141421 A1* | 7/2004 | Cheng et al. | 367/181 |
| 2004/0227238 A1* | 11/2004 | Hashimoto | H01L 24/24 257/738 |
| 2007/0034997 A1* | 2/2007 | Bauer | H01L 23/49524 257/676 |
| 2008/0099900 A1* | 5/2008 | Oganesian | H01L 23/3114 257/678 |
| 2011/0169139 A1* | 7/2011 | Lin et al. | 257/621 |
| 2011/0298000 A1* | 12/2011 | Liu et al. | 257/99 |

\* cited by examiner

*Primary Examiner* — Khiem D Nguyen
(74) *Attorney, Agent, or Firm* — Liu & Liu

(57) ABSTRACT

A chip package is provided. The chip package comprises a semiconductor chip, an isolation layer, a redistributing metal layer, and a bonding pad. The semiconductor chip has a first conducting pad disposed on a lower surface, and a first hole corresponding to the first conducting pad. The first hole and the isolation layer extend from an upper surface to the lower surface to expose the first conducting pad. The redistributing metal layer is disposed on the isolation layer and has a redistributing metal line corresponding to the first conducting pad, the redistributing metal line is connected to the first conducting pad through the opening. The bonding pad is disposed on the isolation layer and one side of the semiconductor chip, wherein the redistributing metal line extends to the bonding pad to electrically connect the first conducting pad to the bonding pad. A method thereof is also provided.

18 Claims, 6 Drawing Sheets

CHIP PACKAGE AND MANUFACTURING METHOD THEREOF

RELATED APPLICATIONS

This application claims priority to U.S. provisional Application Ser. No. 61/813,855, filed Apr. 19, 2013, which is herein incorporated by reference.

BACKGROUND

1. Field of Invention

The present invention relates to a package and a method for manufacturing thereof. More particularly, the present invention relates to a chip package with only one side for bonding process.

2. Description of Related Art

With electronic products in daily life becoming smaller and thinner, semiconductor chips disposed in those electronic products have to be miniaturized accordingly. On the other hand, functions of the semiconductor chips are still increasing when they are miniaturized. In order to improve reliabilities of the semiconductor chips, most semiconductor chips are fabricated into chip packages. Bonding wires are bonded to input/output (I/O) conducting pads of the chip packages, and the chip packages are integrated with a printed circuit board (PCB) to perform predetermined functions of the semiconductor chips. FIG. 1A is a top view of the chip package of prior art, and FIG. 1B is a cross-sectional view of AA' line in FIG. 1A. As illustrated in FIG. 1A and FIG. 1B, the semiconductor chip package 1 includes a semiconductor chip 2 and a plurality of bonding wires 4. The semiconductor chip 2 has a plurality of I/O conducting pads 2a and a plurality of holes 2b (labeled in dot lines). As shown in FIG. 1B, when the semiconductor chip 2 is fabricated into the semiconductor chip package 1, etching processes are performed from an upper surface US to a lower surface DS of the semiconductor chip 2 to yield the plurality of holes 2b. Therefore, the plurality of I/O conducting pads 2a is exposed. The bonding wires 4 are respectively bonded to the I/O conducting pads 2a such that a PCB could be electrically connected to the semiconductor chip 2 through the bonding wires 4. To perform the operation of bonding the bonding wires 4 to the I/O conducting pads 2a, the holes 2b formed by the etching processes are required to be deep and board enough so as to expose the I/O conducting pads 2a and provide space for a bonding-wire carrier to enter therein. As illustrated in FIG. 1B, a distance a must exist between sidewalls of the hole 2b and the connection of bonding wire 4 and the I/O conducting pads 2a. In other words, large wire-bonding area is required. Therefore, space for interconnections in the semiconductor chip 2 with a given area is accordingly limited by the distance a. As aforementioned, functions of the semiconductor chips are still required to be increased even when they are miniaturized. Therefore, in the semiconductor chip 2 with a given area, space for interconnections should be increased to provide more flexibility on layout design of interconnections such that functions of the semiconductor chip 2 could be further enhanced. However, known chip packages and manufacturing thereof that require large wire-bonding area and limit the space for interconnections in the semiconductor chip.

SUMMARY

The present disclosure provides a chip package and a method thereof. The chip package has special design for bonding such that significantly reduces wire-bonding area required. Therefore, more volume of the semiconductor chip with a given area is retained, and offers more space for interconnections therein.

The present disclosure, in one aspect, relates to a chip package. The chip package includes a semiconductor chip, an isolation layer, a redistributing metal layer, and at least one bonding pad. The semiconductor chip includes an upper surface and a lower surface. The semiconductor chip has at least one first conducting pad disposed on the lower surface, and a first hole corresponding to the first conducting pad on the lower surface, the first hole extending from the upper surface to the lower surface to expose the first conducting pad. The isolation layer extends from the upper surface to the lower surface. Part of the isolation layer is positioned in the first hole, wherein the isolation layer has at least one opening to expose the first conducting pad. The redistributing metal layer is disposed on the isolation layer and has at least one redistributing metal line corresponding to the first conducting pad. The redistributing metal line is electrically connecting to the first conducting pad through the opening. The bonding pad is disposed on the isolation layer and positioned at a side of the semiconductor chip. The redistributing metal line extends to the bonding pad to electrically connect the bonding pad positioned at the side and the first conducting pad disposed on the lower surface of the semiconductor chip.

In various embodiments of the present disclosure, the first conducting pad is positioned at other side without being positioned at the side where the bonding pad is positioned.

In various embodiments of the present disclosure, the chip package further includes at least one first bonding wire and a printed circuit board. The first bonding wire is electrically connected to the bonding pad. The first bonding wire extends from the bonding pad to the printed circuit board and is electrically connected to the printed circuit board.

In various embodiments of the present disclosure, the semiconductor chip further includes at least one second conducting pad and at least one second hole. The second conducting pad is disposed on the lower surface and positioned at the side of the semiconductor chip. The second hole is corresponding to the second conducting pad. The second hole extends from the upper surface to the lower surface to expose the second conducting pad, and the isolation layer has at least one opening to expose the second conducting pad. An angle between a sidewall of the second hole and the lower surface is substantially 55-65 degree.

In various embodiments of the present disclosure, the chip package further includes at least one first bonding wire, at least one second bonding wire, and a printed circuit board. The first bonding wire is electrically connected to the bonding pad. The second bonding wire is electrically connected to the second conducting pad. The first bonding wire and the second bonding wire respectively extends from the bonding pad and the second conducting pad to the printed circuit board, and the first bonding wire, the second bonding wire are electrically connected to the printed circuit board.

In various embodiments of the present disclosure, the second bonding wire has a connection to the second conducting pad, and a distance between the connection and sidewalls of the second hole is substantially greater than 50 µm.

In various embodiments of the present disclosure, the chip package further includes at least one dam structure and a protective lid. The dam structure is disposed on the lower surface of the semiconductor chip. The dam structure is sandwiched by the protective lid and the semiconductor chip.

The present disclosure, in the other aspect, relates to a method of manufacturing a chip package. The method includes forming a semiconductor chip with an upper surface and a lower surface, the semiconductor chip having at least one first conducting pad disposed on the lower surface, and at least one first hole extending from the upper surface to the lower surface to expose the first conducting pad. The method further includes forming an isolation layer extending from the upper surface to the lower surface, part of the isolation layer is disposed in the first hole, wherein the isolation layer has at least one opening to expose the first conducting pad. The method further includes forming at least one redistributing metal line on the isolation layer, the redistributing metal line electrically connected to the first conducting pad through the opening. The method further includes forming at least one bonding pad disposed on the isolation layer and positioned at a side of the semiconductor chip, wherein the redistributing metal line extends to the bonding pad to electrically connect the bonding pad positioned at the side and the first conducting pad disposed on the lower surface of the semiconductor chip.

In various embodiments of the present disclosure, the first conducting pad is formed at other sides of the semiconductor chip without being formed at the side where the bonding pad is formed.

In various embodiments of the present disclosure, the method further includes bonding at least one first bonding wire electrically connected to the bonding pad. The method further includes providing a printed circuit board, wherein the first bonding wire extends from the bonding pad to the printed circuit board such that the bonding pad is electrically connected to the printed circuit board.

In various embodiments of the present disclosure, the operation of forming the semiconductor chip further includes forming at least one second conducting pad disposed on the lower surface and positioned at the side of the semiconductor chip; and forming at least one second hole extending from the upper surface to the lower surface to expose the second conducting pad, and the isolation layer having at least one opening to expose the second conducting pad, wherein, an angle between a sidewall of the second hole and the lower surface is substantially 55-65 degree.

In various embodiments of the present disclosure, the method further includes bonding at least one first bonding wire electrically connected to the bonding pad. The method further includes bonding at least one second bonding wire electrically connected to the second conducting pad. The method further includes and providing a printed circuit board, wherein the first bonding wire and the second bonding wire respectively extends from the bonding pad and the second conducting pad to the printed circuit board, and the bonding pad and the second conducting pad are respectively electrically connected to the printed circuit board.

In various embodiments of the present disclosure, the second bonding wire has a connection to the second conducting pad, and a distance between the connection and sidewalls of the second hole is substantially greater than 50 μm.

In various embodiments of the present disclosure, the method further includes forming at least one dam structure disposed on the lower surface of the semiconductor chip. The method further includes providing a protective lid, wherein the dam structure is sandwiched by the protective lid and the semiconductor chip.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1A:
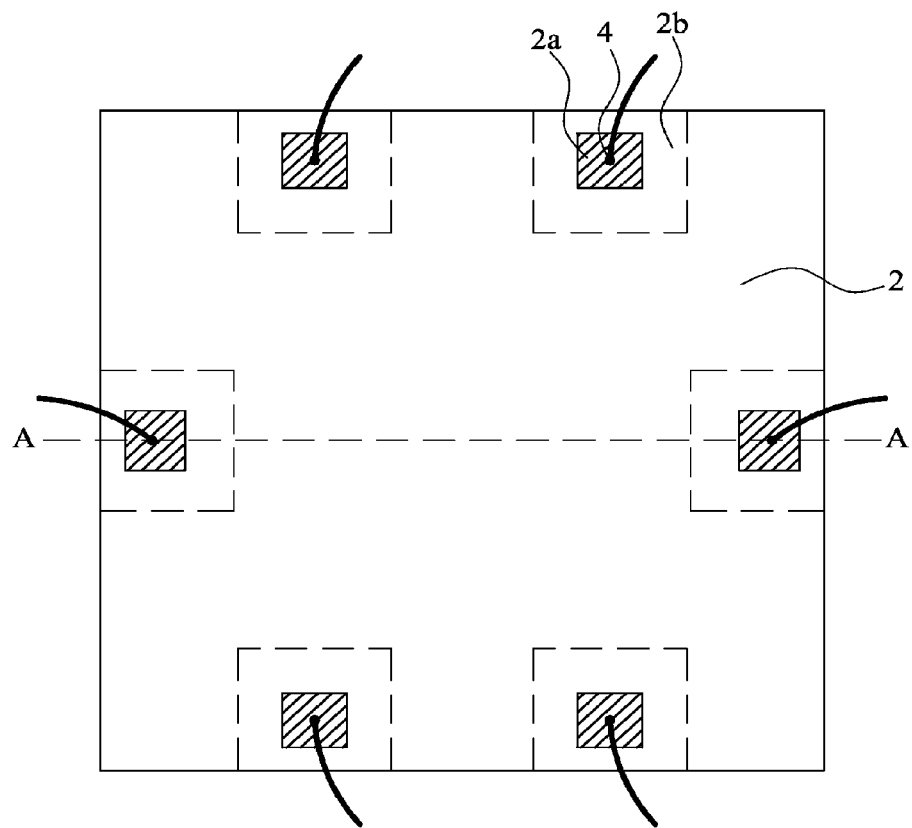
FIG. 1A is a top-view of a semiconductor chip package in prior arts.
Figure 1B:
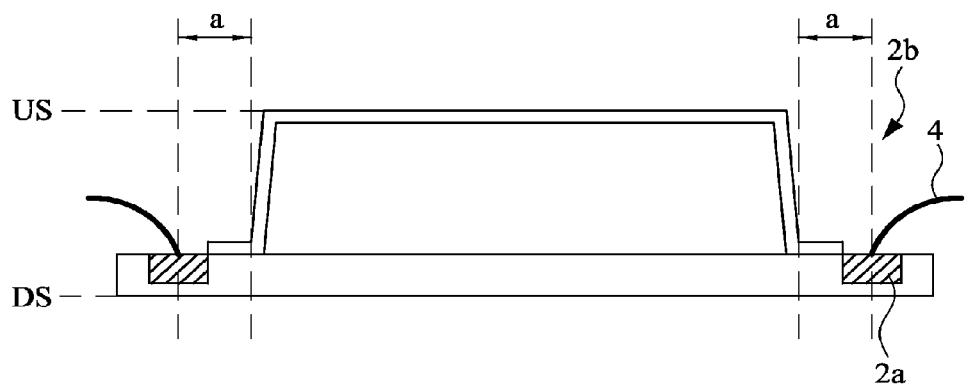
FIG. 1B is a cross-sectional view of AA' line in FIG. 1A.

Reference will now be made in detail to the present embodiments of the invention, examples of which are illustrated in the accompanying drawings. Wherever possible, the same reference numbers are used in the drawings and the description to refer to the same or like parts.

Figure 2A:
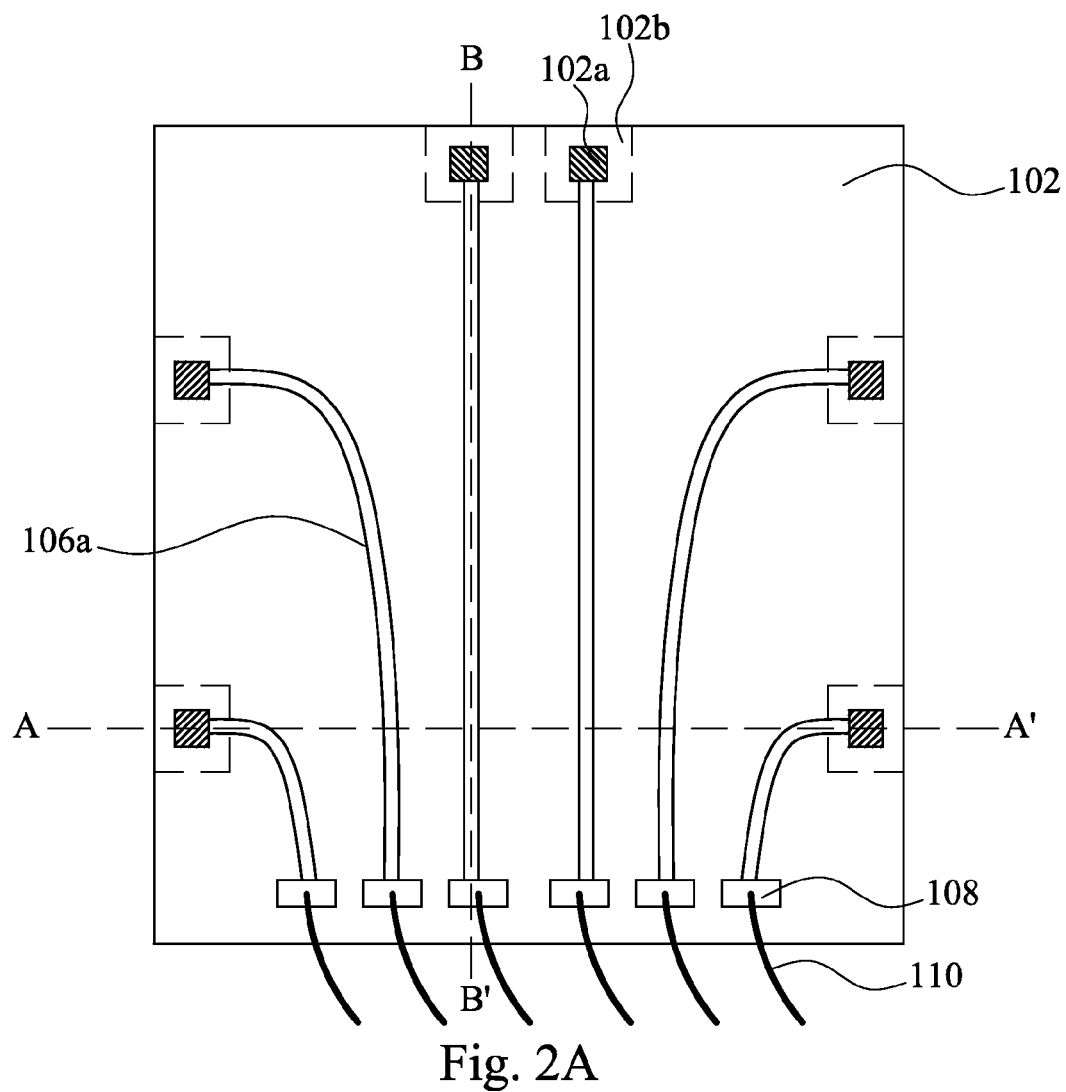
FIG. 2A is a top-view of a semiconductor chip package according to the first embodiment of the present disclosure.
Figure 2B:
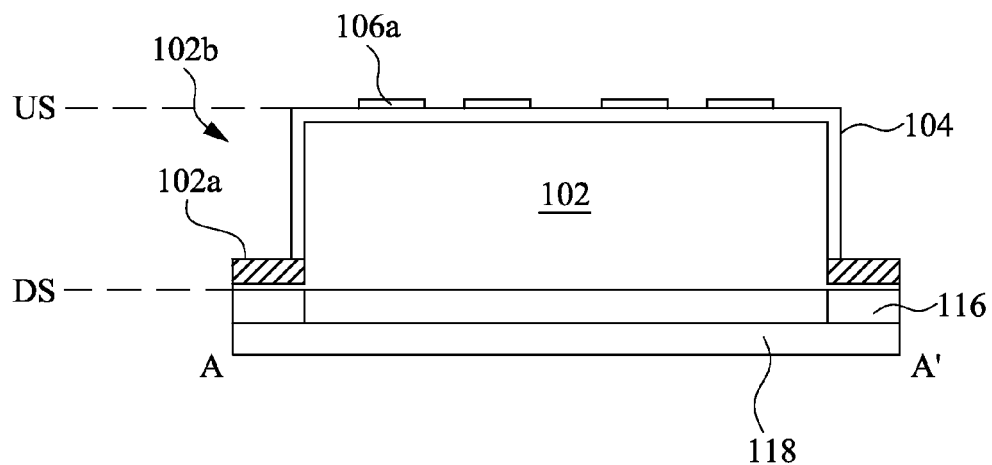
FIG. 2B is a cross-sectional view of AA' line in FIG. 2A.

FIG. 2A is a top-view of a semiconductor chip package according to the first embodiment of the present disclosure. FIG. 2B is a cross-sectional view of AA' line in FIG. 2A.

As illustrated on FIG. 2A and FIG. 2B, the semiconductor chip package 10 according to the first embodiment of the present disclosure includes a semiconductor chip 102, an isolation layer 104, a redistributing metal layer 106, and bonding pads 108. The semiconductor chip 102 has an upper surface US and a lower surface DS. The semiconductor chip 102 has first conducting pads 102a and first holes 102b. As shown in FIG. 2A, within the semiconductor chip package 10 according to the first embodiment of the present disclosure, the semiconductor chip 102 has six first conducting pads 102a disposed on the lower surface DS, and six first holes 102b extending from the upper surface US to the lower surface DS. Those six first holes 102b are respectively corresponding to those six first conducting pads 102a, and expose those first conducting pads 102a disposed on the lower surface DS. The semiconductor chip 102, for example, could be active or passive elements, electronic components, optical-electronic devices, micro electro mechanical systems (MEMS), micro fluidic systems, physical sensors, image sensors, light emitting diodes (LED), solar cells, RF circuits, accelerators, gyroscopes, micro actuators, surface acoustic wave components, pressure sensors, ink printer heads. However, the present disclosure is not limited thereto. The first conducting pads 102a of the semiconductor chip 102 could be respectively regarded as an input conducting pad or an output conducting pad (I/O pads) for signal communicating between integrated circuit in the semiconductor chip 102 and, for example, another chip and/or a printed circuit board (PCB). Therefore, the quantity of the first conducting pads 102a is not limited to six as illustrated in FIG. 2A. According to various demands or requirements, the quantity of the first conducting pads 102a could be well adjusted into more or fewer first conducting pads 102a distributed on the lower surface DS of the semiconductor chip 102. The first conducting pad 102a could include single or multi-layers of metal such as aluminum, palladium, nickel, gold. However, the present disclosure is not limited thereto. Referring to FIG. 2B, the isolation layer 104 extends from the upper surface US to the lower surface DS. Part of the isolation layer 104 is positioned in the first hole 102b. The isolation layer 104 has at least one opening to expose the first conducting pad 102a. The isolation layer 104 could include silicon oxide, silicon nitride, silicon oxynitride, or other suitable isolating materials. The isolation layer 104 could be formed by chemical vapor deposition (CVD). However, the present disclosure is not limited to it. The redistributing metal layer 106 is disposed on the isolation layer 104. Referring to FIG. 2A and FIG. 2B, the redistributing metal layer 106 has at least one redistributing metal line 106a corresponding to the first conducting pad 102a, and the redistributing metal line 106a is electrically connecting to the first conducting pad 102a through the opening. The redistributing metal layer 106 could include aluminum, copper, nickel, or other suitable conductive materials. The redistributing metal layer 106 could be formed by overall depositing the conductive materials on the isolation layer 104, and patterned by litho-etching processes to yield the redistributing metal lines 106a. As illustrated in FIG. 2A, each first conducting pad 102a is respectively corresponding to a redistributing metal line 106a.

Figure 2C:
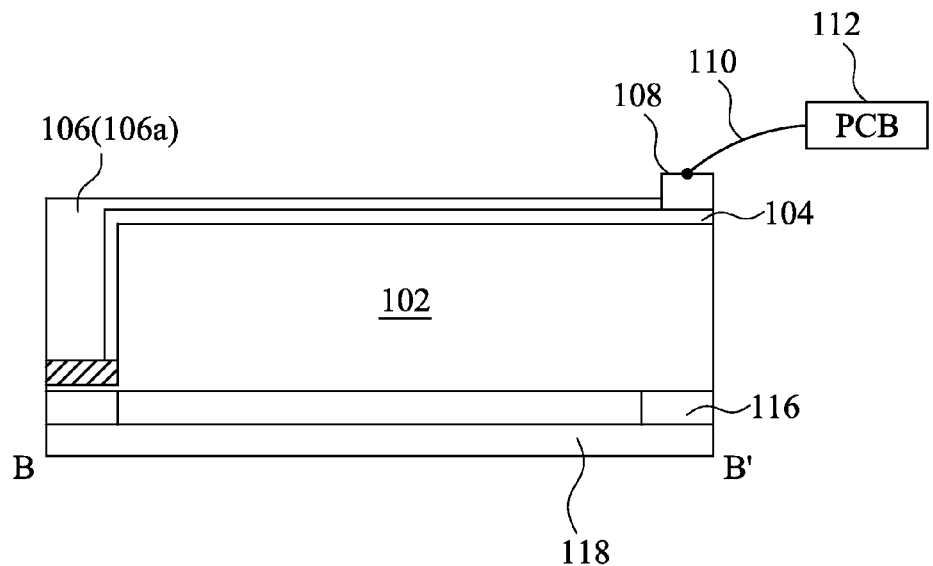
FIG. 2C is a cross-sectional view of BB' line in FIG. 2A.

FIG. 2A is a top-view of the semiconductor chip package 10 according to the first embodiment of the present disclosure. FIG. 2C is a cross-sectional view of BB' line in FIG. 2A. Refer to FIG. 2A and FIG. 2C, the bonding pads 108 are also disposed on the isolation layer 104. The bonding pads 108 are positioned at a side of the semiconductor chip 102. The bonding pads 108 provide bonding sites of the semiconductor chip package 10 according to the first embodiment of the present disclosure. As illustrated in FIG. 2A, first bonding wires 110 are respectively bonded to the bonding pads 108. The bonding pads 108 could be formed in a similar way as aforementioned redistributing metal layer 106. The bonding pads 108 could be formed by overall depositing the conductive materials on the isolation layer 104, and patterned by litho-etching processes to yield the bonding pads 108 positioned at the side of the semiconductor chip 102. It should be noticed that the redistributing metal line 106a extends to the bonding pad 108 to electrically connect the bonding pad 108 positioned at the side and the first conducting pad 102a disposed on the lower surface DS of the semiconductor chip 102. In various embodiments of the present disclosure, the semiconductor chip package 10 further includes at least one first bonding wire 110 and a printed circuit board 112. The first bonding wire 110 is electrically connected to the bonding pad 110. In other words, the bonding pads 108 positioned at the side of the semiconductor chip 102 could be further bonded to the first bonding wire 110 in following processes. As illustrated in FIG. 2C, the first bonding wire 110 extends from the bonding pad 108 to the printed circuit board 112 and is electrically connected to the printed circuit board 112. Therefore, the first conducting pad 102a disposed on the lower surface DS of the semiconductor chip 102 in the semiconductor chip package 10 according to the first embodiment of the present disclosure could be electrically connected to the printed circuit board 112 through the first bonding wire 110, the bonding pad 108, and the redistributing metal line 106a. Accordingly, the semiconductor chip 102 could be electrically connected to the printed circuit board 112 and perform signal communication with the printed circuit board 112 through the first conducting pads 102a (I/O conducting pad). Besides, the first bonding wires 110 could also be electrically connected to other semiconductor chips or other semiconductor interposer, such that the semiconductor chip 102 could be integrated with other semiconductor chips or other semiconductor interposers to form a 3D-IC stacking structure. One of various characteristics according to the present disclosure is that the special patterned redistributing metal layer 106 (the redistributing metal lines 106a formed by, for example, litho-etching processes) collects all electrical connection paths of the first conducting pads 102a distributed on the lower surface DS of the semiconductor chip 102 (as positioned at other three sides illustrated in FIG. 2A), and respectively electrically connects all of the first conducting pads 102a to the bonding pad 108 positioned at one side of the semiconductor chip 102. Accordingly, compared to prior arts illustrated in FIG. 1A, the semiconductor chip package 10 according to the first embodiment of the present disclosure has a denser bonding area, which is only positioned at one side of the semiconductor chip 102, than those of prior arts. Therefore, the throughput of bonding in the semiconductor chip package is significantly improved since the bonding process could be performed densely. Besides, the bonding process of the semiconductor chip package is simplified and becomes more efficient because the bonding process is performed at only one side of the semiconductor chip package. As illustrated in FIG. 2A and FIG. 2C, in various embodiments of the present disclosure, the first conducting pad 102a is positioned at other side without being positioned at the side where the bonding pad 108 is positioned. In other words, the first bonding wires 110 of the semiconductor chip package 10 are not disposed in the first holes 102b, but are respectively disposed on the bonding pad 108 on the upper surface US of the semiconductor chip 102. Therefore, a bonding-wire carrier is not necessary to dive into the first hole 102, which exposes the first conducting pad 102a, during the bonding process. The bonding-wire carrier could perform the bonding process by respectively bonding the first bonding wires 110 to the bonding pads 108, which are disposed on the upper surface US of the semiconductor chip 102. Therefore, extra wire-bonding area is not required since the bonding-wire carrier only performs the bonding process on the upper surface US without diving into the first holes 102b. Accordingly, the semiconductor chip package 10 according various embodiments of the present disclosure retains more volume of the semiconductor chip 102 with a given area, and more volume of the semiconductor chip 102 offers more space for interconnections therein. Not only flexibility for design the interconnections within the semiconductor chip 102 is increased, but also capability of the semiconductor chip 102 is further improved. Accordingly, the semiconductor chip package 10 according to various embodiments of the present disclosure is capable to contain more interconnections within the semiconductor chip 102 so as to perform multi-functions. As illustrated in FIG. 2B and FIG. 2C, in various embodiments of the present disclosure, the semiconductor chip package 10 further includes at least one dam structure 116, and a protective lid 118. The dam structure 116 is disposed on the lower surface DS of the semiconductor chip 102. The dam structure 116 is sandwiched by the protective lid 118 and the semiconductor chip 102. Therefore, the first conducting pads 102a or other devices disposed on the lower surface DS of the semiconductor chip 102 could be further protected. The protective lid 118 could include glass, metal, ceramics, polymer materials, semiconductor materials, or combinations thereof. As illustrated in FIG. 2B and FIG. 2C, the protective lid 118, the dam structure 116, and the semiconductor chip 102 mutually surround a closed space, and part of the semiconductor chip 102 could work in the closed space. The dam structure 116 could also include glass, metal, ceramics, polymer materials, semiconductor materials, or combinations thereof. The dam structure 116 could be fixed between the protective lid 118 and the semiconductor chip 102 by an adhesion layer. Or the dam structure 116 could be an adhesive polymer and fix itself between the protective lid 118 and the semiconductor chip 102 by curing processes such as being heated or applied UV.

Figure 2D:
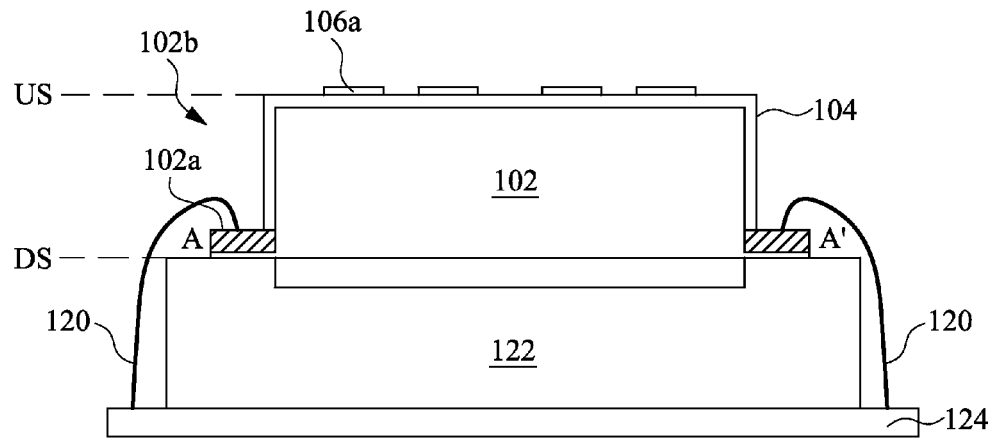
FIG. 2D is side view of a semiconductor chip package according to other embodiment of the present disclosure.
Figure 2E:
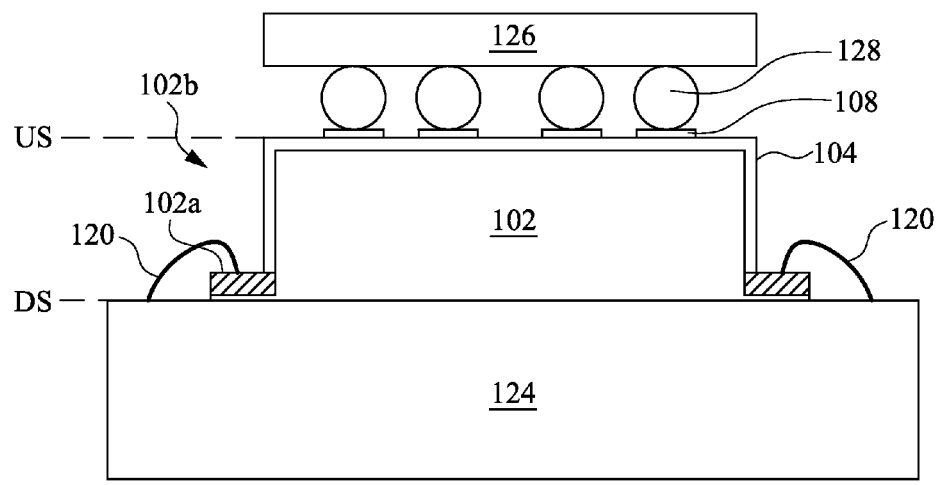
FIG. 2E is side view of a semiconductor chip package according to other embodiment of the present disclosure.

FIG. 2D is side view of a semiconductor chip package according to other embodiment of the present disclosure. Referring to FIG. 2D, in other embodiment of the present disclosure, the chip package further includes at least one third bonding wire 120, a microelectromechanical system (MEMS) 122, and a printed circuit board 124. The third bonding wire 120 is electrically connected to the first conducting pad 102a. The microelectromechanical system (MEMS) 122 is disposed below the lower surface DS. The third bonding wire 120 extends from the first conducting pad 102a, and is electrically connected to the printed circuit board 124. In addition, the microelectromechanical system (MEMS) 122 could be replaced by a semiconductor chip or an interposer. FIG. 2E is side view of a semiconductor chip package according to other embodiment of the present disclosure. Referring to FIG. 2E, in other embodiment of the present disclosure, the chip package further includes at least one third bonding wire 120, at least one solder ball 128, a chip 126, and a printed circuit board 124. The third bonding wire 120 is electrically connected to the first conducting pad 102a. The solder ball 128 is electrically connected to the bonding pad 108. The chip 126 is electrically connected to the bonding pad 108 through the solder ball 128. The third bonding wire 120 extends from the first conducting pad 102a, and is electrically connected to the printed circuit board 124. The printed circuit board 124 also could be replaced by a semiconductor chip or an interposer. Therefore, the chip package according to various embodiments of the present disclosure could be properly combined with other semiconductor chips, interposers, and/or printed circuit boards such that the chip package could more flexibility in application and have multiple functions.

Figure 3A:
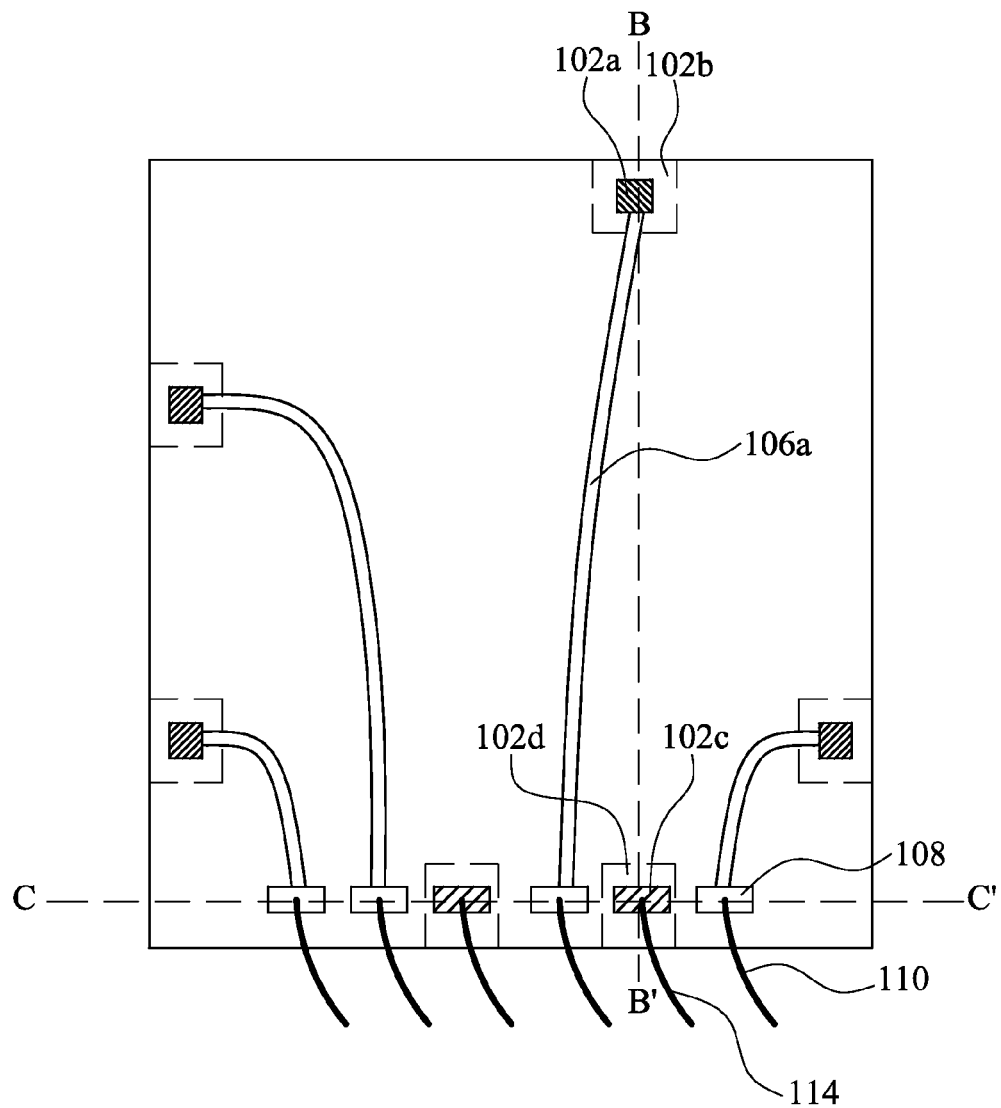
FIG. 3A is a top-view of a semiconductor chip package according to the second embodiment of the present disclosure.
Figure 3B:
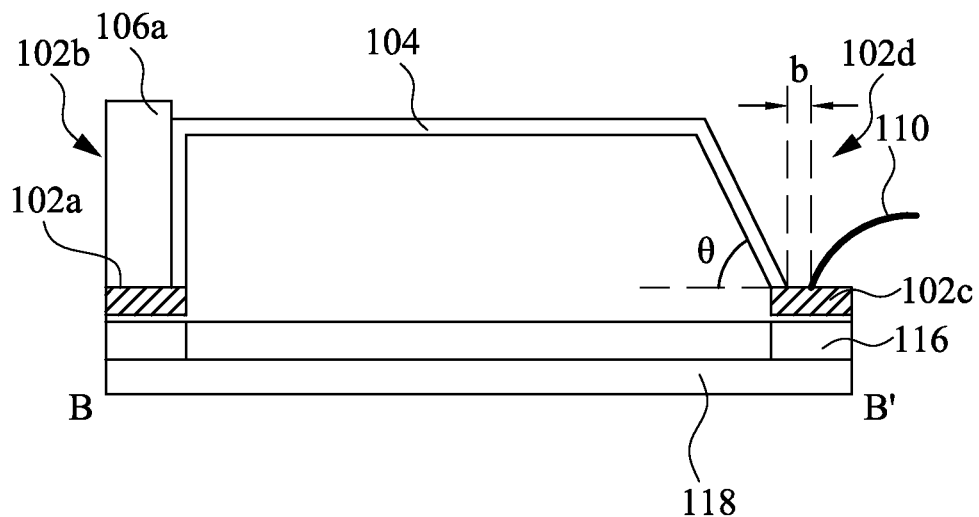
FIG. 3B is a cross-sectional view of AA' line in FIG. 3A.

FIG. 3A is a top-view of a semiconductor chip package according to the second embodiment of the present disclosure. FIG. 3B is a cross-sectional view of AA' line in FIG. 3A.

As illustrated in FIG. 3A and FIG. 3B, the semiconductor chip package 20 according to the second embodiment of the present disclosure includes a semiconductor chip 102, an isolation layer 104, a redistributing metal layer 106, and bonding pads 108. The semiconductor chip 102 has an upper surface US and a lower surface DS. The semiconductor chip 102 includes the first conducting pads 102a, the first holes 102b, the second conducting pads 102c, and the second holes 102d. As shown in FIG. 3A, within the semiconductor chip package 20 according to the second embodiment of the present disclosure, the semiconductor chip 102 has four first conducting pads 102a disposed on the lower surface DS, and four first holes 102b extending from the upper surface US to the lower surface DS. Also shown in FIG. 3A, within the semiconductor chip package 20 according to the second embodiment of the present disclosure, the semiconductor chip 102 has two second conducting pads 102c disposed on the lower surface DS, and two second holes 102d extending from the upper surface US to the lower surface DS. Those four first holes 102b are respectively corresponding to those four first conducting pads 102a, and expose those first conducting pads 102a disposed on the lower surface DS. Those four first holes 102b are respectively corresponding to those four first conducting pads 102a, and expose those first conducting pads 102a disposed on the lower surface DS. Those two second holes 102d are respectively corresponding to those two second conducting pads 102c, and expose those second conducting pads 102c disposed on the lower surface DS. The semiconductor chip 102, for example, could be active or passive elements, electronic components, optical-electronic devices, micro electro mechanical systems (MEMS), micro fluidic systems, physical sensors, image sensors, light emitting diodes (LED), solar cells, RF circuits, accelerators, gyroscopes, micro actuators, surface acoustic wave components, pressure sensors, ink printer heads. However, the present disclosure is not limited thereto. The first conducting pads 102a and the second conducting pads 102c of the semiconductor chip 102 could be respectively regarded as an input conducting pad or an output conducting pad (I/O pads) for signal communicating between integrated circuit in the semiconductor chip 102 and, for example, another chip and/or a printed circuit board (PCB). Therefore, the quantity of the first conducting pads 102a and the quantity of the second conducting pads 102c are not limited to four and two as illustrated in FIG. 3A. According to various demands or requirements, the quantity of the first conducting pads 102a and the quantity of the second conducting pads 102c could be properly adjusted into more or fewer first conducting pads 102a and second conducting pads 102c distributed on the lower surface DS of the semiconductor chip 102. The first conducting pad 102a and the second conducting pad 102c could include single or multi-layers of metal such as aluminum, palladium, nickel, gold. However, the present disclosure is not limited thereto. Referring to FIG. 3B, the isolation layer 104 extends from the upper surface US to the lower surface DS. Part of the isolation layer 104 is positioned in the first hole 102b and the second hole 102d. The isolation layer 104 has openings to expose the first conducting pad 102a and the second conducting pads 102c. The isolation layer 104 could include silicon oxide, silicon nitride, silicon oxynitride, or other suitable isolating materials. The isolation layer 104 could be formed by chemical vapor deposition (CVD). However, the present disclosure is not limited to it. The redistributing metal layer 106 is disposed on the isolation layer 104. Referring to FIG. 2A and FIG. 2B, the redistributing metal layer 106 has at least one redistributing metal line 106a corresponding to the first conducting pad 102a, and the redistributing metal line 106a is electrically connecting to the first conducting pad 102a through the opening. The redistributing metal layer 106 could include aluminum, copper, nickel, or other suitable conductive materials. The redistributing metal layer 106 could be formed by overall depositing the conductive materials on the isolation layer 104, and patterned by litho-etching processes to yield the redistributing metal lines 106a. As illustrated in FIG. 3A, each first conducting pad 102a is respectively corresponding to a redistributing metal line 106a.

Figure 3C:
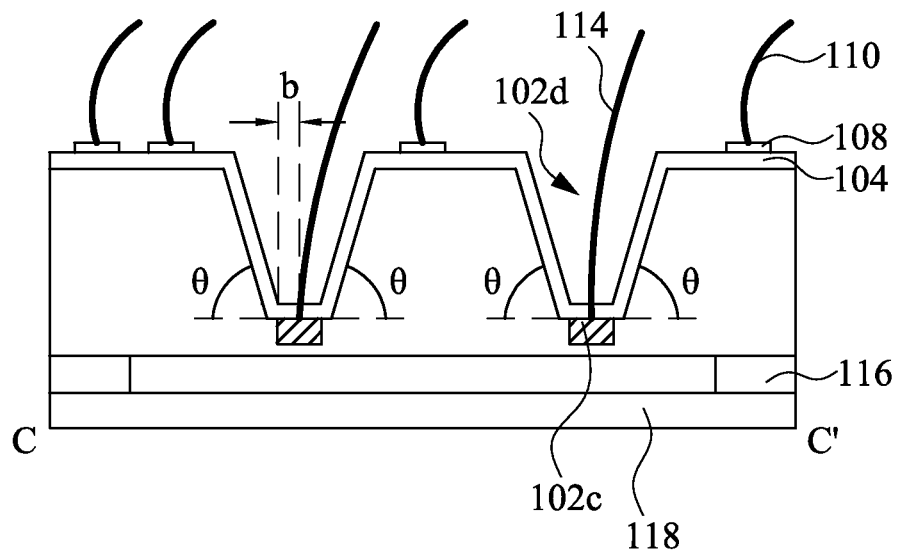
FIG. 3C is a cross-sectional view of BB' line in FIG. 3A.

FIG. 3A is a top-view of the semiconductor chip package 20 according to the second embodiment of the present disclosure. FIG. 3C is a cross-sectional view of BB' line in FIG. 3A. Refer to FIG. 3A and FIG. 3C, the bonding pads 108 are also disposed on the isolation layer 104. The bonding pads 108 are positioned at a side of the semiconductor chip 102. The bonding pads 108 provide bonding sites of the semiconductor chip package 10 according to the first embodiment of the present disclosure. As illustrated in FIG. 3A, first bonding wires 110 are respectively bonded to the bonding pads 108. The bonding pads 108 could be formed in a similar way as aforementioned redistributing metal layer 106. The bonding pads 108 could be formed by overall depositing the conductive materials on the isolation layer 104, and patterned by litho-etching processes to yield the bonding pads 108 positioned at the side of the semiconductor chip 102. Similar to aforementioned first embodiment of the present disclosure, the redistributing metal line 106a extends to the bonding pad 108 to electrically connect the bonding pad 108 positioned at the side and the first conducting pad 102a disposed on the lower surface DS of the semiconductor chip 102. In should be noticed that the second conducting pad 102c is disposed on the side where the bonding pad 108 is positioned. The second conducting pad 102c is exposed by the second hole 102d positioned at the same side. As shown in FIG. 3C, in various embodiments of the present disclosure, the semiconductor chip package 20 further includes at least one first bonding wire 110, at least one second bonding wire 114, and a printed circuit board (not shown). The first bonding wire 110 is electrically connected to the bonding pad 108. The second bonding wire 114 is electrically connected to the second conducting pad 102c. The first bonding wire 110 and the second bonding wire 114 respectively extends from the bonding pad 108 and the second conducting pad 102c to the printed circuit board, and the first bonding wire 110, the second bonding wire 114 are electrically connected to the printed circuit board. The second conducting pad 102c and the bonding pad 108 positioned at the side of the semiconductor chip 102 could be further respectively bonded to the first bonding wire 110 and the second bonding wire 114 in following processes. Therefore, the first conducting pad 102a disposed on the lower surface DS of the semiconductor chip 102 in the semiconductor chip package 20 according to the second embodiment of the present disclosure could be electrically connected to the printed circuit board through the first bonding wire 110. The second conducting pad 102c disposed on the lower surface DS of the semiconductor chip 102 in the semiconductor chip package 20 according to the second embodiment of the present disclosure also could be electrically connected to the printed circuit board through the second bonding wire 114. Accordingly, the semiconductor chip 102 could be electrically connected to the printed circuit board 112 and perform signal communication with the printed circuit board respectively through the first conducting pads 102a and the second conducting pads 102c (I/O conducting pad). Besides, the first bonding wires 110 and/or the second bonding wires 114 could also be electrically connected to other semiconductor chips or other semiconductor interposer, such that the semiconductor chip 102 could be integrated with other semiconductor chips or other semiconductor interposers to form a 3D-IC stacking structure. Similar to the first embodiment of the present disclosure, the special patterned redistributing metal layer 106 (the redistributing metal lines 106a formed by, for example, litho-etching processes) collects all electrical connection paths of the first conducting pads 102a distributed on the lower surface DS of the semiconductor chip 102 (as positioned at other three sides illustrated in FIG. 3A), and respectively electrically connects all of the first conducting pads 102a to the bonding pad 108 positioned at one side of the semiconductor chip 102. Accordingly, compared to prior arts illustrated in FIG. 1A, the semiconductor chip package 20 according to the first embodiment of the present disclosure has a denser bonding area, which is only positioned at one side of the semiconductor chip 102, than those of prior arts. Therefore, the throughput of bonding in the semiconductor chip package is significantly improved since the bonding process could be performed densely. Besides, the bonding process of the semiconductor chip package is simplified and becomes more efficient because the bonding process is performed at only one side of the semiconductor chip package. As illustrated in FIG. 3A and FIG. 3C, in various embodiments of the present disclosure, the first conducting pad 102a is positioned at other side without being positioned at the side where the bonding pad 108 is positioned. In other words, the first bonding wires 110 of the semiconductor chip package 10 are not disposed in the first holes 102b, but are respectively disposed on the bonding pad 108 on the upper surface US of the semiconductor chip 102. Therefore, a bonding-wire carrier is not necessary to dive into the first hole 102, which exposes the first conducting pad 102a, during the bonding process. The bonding-wire carrier could perform the bonding process by respectively bonding the first bonding wires 110 to the bonding pads 108, which are disposed on the upper surface US of the semiconductor chip 102. Therefore, extra wire-bonding area is not required since the bonding-wire carrier only performs the bonding process on the upper surface US without diving into the first holes 102b. Before the bonding process for bonding the second bonding wires 114 to the second conducting pads 102c, proper etching process could be utilized to form an angle θ between a sidewall of the second hole 102d and the lower surface DS (as illustrated in FIG. 3C). The angle θ is substantially 55-65 degree. Therefore, the V-shaped sidewall of the second hole 102d provides sufficient space for the bonding-wire carrier to enter the second hole 102d, and bond the second bonding wire 114 to the second conducting pad 102d. As shown in FIG. 3C, the required bonding gap, which is the minimum distance between the second bonding wire 114 and sidewalls of the second hole 102d, could be reduced from substantially 200-300 μm to substantially 50 μm. In various embodiments of the present disclosure, the second bonding wire has a connection to the second conducting pad, and a distance b between the connection and sidewalls of the second hole is substantially greater than 50 μm. Therefore, compared to prior arts, less volume of the semiconductor chip 102 is reduced for the bonding process for bonding the second bonding wires 114 to the second conducting pads 102c. Accordingly, the semiconductor chip package 20 according various embodiments of the present disclosure retains more volume of the semiconductor chip 102 with a given area, and more volume of the semiconductor chip 102 offers more space for interconnections therein. Not only flexibility for design the interconnections within the semiconductor chip 102 is increased, but also capability of the semiconductor chip 102 is further improved. Accordingly, the semiconductor chip package 10 according to various embodiments of the present disclosure is capable to contain more interconnections within the semiconductor chip 102 so as to perform multi-functions. In addition, as illustrated in FIG. 3B and FIG. 3C, in various embodiments of the present disclosure, the semiconductor chip package 20 further includes at least one dam structure 116, and a protective lid 118. The dam structure 116 is disposed on the lower surface DS of the semiconductor chip 102. The dam structure 116 is sandwiched by the protective lid 118 and the semiconductor chip 102. Therefore, the first conducting pads 102a or other devices disposed on the lower surface DS of the semiconductor chip 102 could be further protected. The protective lid 118 could include glass, metal, ceramics, polymer materials, semiconductor materials, or combinations thereof. As illustrated in FIG. 2B and FIG. 2C, the protective lid 118, the dam structure 116, and the semiconductor chip 102 mutually surround a closed space, and part of the semiconductor chip 102 could work in the closed space. The dam structure 116 could also include glass, metal, ceramics, polymer materials, semiconductor materials, or combinations thereof. The dam structure 116 could be fixed between the protective lid 118 and the semiconductor chip 102 by an adhesion layer. Or the dam structure 116 could be an adhesive polymer and fix itself between the protective lid 118 and the semiconductor chip 102 by curing processes such as being heated or applied UV.

It should be noticed that the special patterned redistributing metal layer (the redistributing metal lines) collects all electrical connection paths of the first conducting pads distributed on the lower surface DS of the semiconductor chip and respectively electrically connects all of the first conducting pads to the bonding pad positioned at one side of the semiconductor chip. Therefore, the semiconductor chip package according various embodiments of the present disclosure has a denser bonding area, which is only positioned at one side of the semiconductor chip 102, than those of prior arts. The bonding process of the semiconductor chip package is simplified and becomes more efficient because the bonding process is performed at only one side of the semiconductor chip package. Also in various embodiments of the present disclosure, the first bonding wires are not disposed in the first holes, but are respectively disposed on the bonding pad on the upper surface US of the semiconductor chip. Therefore, a bonding-wire carrier is not necessary to dive into the first hole, and the bonding-wire carrier could perform the bonding process by respectively bonding the first bonding wires 110 to the bonding pads 108, which are disposed on the upper surface US of the semiconductor chip 102. Therefore, extra wire-bonding area is not required since the bonding-wire carrier only performs the bonding process on the upper surface US without diving into the first holes. Accordingly, the semiconductor chip package according various embodiments of the present disclosure retains more volume of the semiconductor chip, and offers more space for interconnections therein. Not only flexibility for design the interconnections within the semiconductor chip is increased, but also capability of the semiconductor chip is further improved.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A chip package, comprising:
   a semiconductor chip with an upper surface and a lower surface, the semiconductor chip having at least one first conducting pad in contact with a sidewall of the semiconductor chip, and a first hole corresponding to the first conducting pad, the first hole extending from the upper surface to the lower surface to expose the first conducting pad;
   an isolation layer extending from the upper surface to the lower surface, part of the isolation layer positioned in the first hole, wherein the isolation layer has at least one opening to expose the first conducting pad;
   a redistributing metal layer disposed on the isolation layer and having at least one redistributing metal line corresponding to the first conducting pad, and the redistributing metal line electrically connecting to the first conducting pad through the opening; and
   at least one bonding pad disposed on the isolation layer and positioned at a side of the semiconductor chip,
   wherein the redistributing metal line extends to the bonding pad to electrically connect the bonding pad positioned at the side and the first conducting pad that contacted with the sidewall of the semiconductor chip.

2. The chip package of claim 1, wherein the first conducting pad is positioned at other side without being positioned at the side where the bonding pad is positioned.

3. The chip package of claim 2, further comprising:
   at least one first bonding wire electrically connected to the bonding pad; and
   a printed circuit board, wherein the first bonding wire extends from the bonding pad to the printed circuit board and is electrically connected to the printed circuit board.

4. The chip package of claim 2, further comprising:
   at least one third bonding wire electrically connected to the first conducting pad;
   a microelectromechanical system (MEMS) disposed below the lower surface; and
   a printed circuit board, wherein the third bonding wire extends from the first conducting pad, and is electrically connected to the printed circuit board.

5. The chip package of claim 2, further comprising:
   at least one third bonding wire electrically connected to the first conducting pad;
   at least one solder ball electrically connected to the bonding pad;
   a chip electrically connected to the bonding pad through the solder ball; and
   a printed circuit board, wherein the third bonding wire extends from the first conducting pad, and is electrically connected to the printed circuit board.

6. The chip package of claim 1, wherein the semiconductor chip further comprises:
   at least one second conducting pad disposed on the lower surface and positioned at the side of the semiconductor chip; and
   at least one second hole corresponding to the second conducting pad, the second hole extending from the upper surface to the lower surface to expose the second conducting pad, and the isolation layer having at least one opening to expose the second conducting pad,
   wherein an angle between a sidewall of the second hole and the lower surface is substantially 55-65 degree.

7. The chip package of claim 6, further comprising:
   at least one first bonding wire electrically connected to the bonding pad;
   at least one second bonding wire electrically connected to the second conducting pad; and
   a printed circuit board, wherein the first bonding wire and the second bonding wire respectively extends from the bonding pad and the second conducting pad to the printed circuit board, and the first bonding wire, the second bonding wire are electrically connected to the printed circuit board.

8. The chip package of claim 7, wherein the second bonding wire has a connection to the second conducting pad, and a distance between the connection and sidewalls of the second hole is substantially greater than 50 μm.

9. The chip package of claim 1, further comprising:
   at least one dam structure disposed on the lower surface of the semiconductor chip; and
   a protective lid, wherein the dam structure is sandwiched by the protective lid and the semiconductor chip.

10. The chip package of claim 1, wherein the bonding pad is disposed in direct contact with the isolation layer.

11. A method of manufacturing a chip package, comprising:
    forming a semiconductor chip with an upper surface and a lower surface, the semiconductor chip having at least one first conducting pad in contact with a sidewall of the semiconductor chip, and at least one first hole extending from the upper surface to the lower surface to expose the first conducting pad;
    forming an isolation layer extending from the upper surface to the lower surface, part of the isolation layer is disposed in the first hole, wherein the isolation layer has at least one opening to expose the first conducting pad;

forming at least one redistributing metal line on the isolation layer, the redistributing metal line electrically connected to the first conducting pad through the opening; and forming at least one bonding pad disposed on the isolation layer and positioned at a side of the semiconductor chip, wherein the redistributing metal line extends to the bonding pad to electrically connect the bonding pad positioned at the side and the first conducting pad that contacted with the sidewall of the semiconductor chip.

12. The method of claim 11, wherein the first conducting pad is formed at other sides of the semiconductor chip without being formed at the side where the bonding pad is formed.

13. The method of claim 12, further comprising:
bonding at least one first bonding wire electrically connected to the bonding pad; and
providing a printed circuit board, wherein the first bonding wire extends from the bonding pad to the printed circuit board such that the bonding pad is electrically connected to the printed circuit board.

14. The method of claim 11, wherein the operation of forming the semiconductor chip further comprises:
forming at least one second conducting pad disposed on the lower surface and positioned at the side of the semiconductor chip; and
forming at least one second hole extending from the upper surface to the lower surface to expose the second conducting pad, and the isolation layer having at least one opening to expose the second conducting pad,
wherein, an angle between a sidewall of the second hole and the lower surface is substantially 55-65 degree.

15. The method of claim 14, further comprising:
bonding at least one first bonding wire electrically connected to the bonding pad;
bonding at least one second bonding wire electrically connected to the second conducting pad; and
providing a printed circuit board, wherein the first bonding wire and the second bonding wire respectively extends from the bonding pad and the second conducting pad to the printed circuit board, and the bonding pad and the second conducting pad are respectively electrically connected to the printed circuit board.

16. The method of claim 15, wherein the second bonding wire has a connection to the second conducting pad, and a distance between the connection and sidewalls of the second hole is substantially greater than 50 μm.

17. The method of claim 11, further comprising:
forming at least one dam structure disposed on the lower surface of the semiconductor chip; and
providing a protective lid, wherein the dam structure is sandwiched by the protective lid and the semiconductor chip.

18. The method of claim 11, wherein the bonding pad is disposed in direct contact with the isolation layer.

* * * * *